United States Patent
Hirose et al.

(10) Patent No.: US 10,372,145 B2
(45) Date of Patent: Aug. 6, 2019

(54) PRESSURE-TYPE FLOW RATE CONTROL DEVICE

(71) Applicant: FUJIKIN INCORPORATED, Osaka (JP)

(72) Inventors: Takashi Hirose, Osaka (JP); Toshihide Yoshida, Osaka (JP); Atsushi Matsumoto, Osaka (JP); Kaoru Hirata, Osaka (JP); Nobukazu Ikeda, Osaka (JP); Kouji Nishino, Osaka (JP); Ryousuke Dohi, Osaka (JP); Katsuyuki Sugita, Osaka (JP)

(73) Assignee: Fujikin Incorporated, Osaka (JP)

( * ) Notice: Subject to any disclaimer, the term of this patent is extended or adjusted under 35 U.S.C. 154(b) by 360 days.

(21) Appl. No.: 15/034,002

(22) PCT Filed: Nov. 25, 2014

(86) PCT No.: PCT/JP2014/005885
§ 371 (c)(1),
(2) Date: May 3, 2016

(87) PCT Pub. No.: WO2015/083343
PCT Pub. Date: Jun. 11, 2015

(65) Prior Publication Data
US 2016/0349763 A1 Dec. 1, 2016

(30) Foreign Application Priority Data
Dec. 5, 2013 (JP) .................................. 2013-252167

(51) Int. Cl.
*F16K 31/02* (2006.01)
*G05D 7/06* (2006.01)
(Continued)

(52) U.S. Cl.
CPC ............. *G05D 7/0635* (2013.01); *F16K 7/14* (2013.01); *F16K 31/007* (2013.01); *H01L 21/67069* (2013.01); *H01L 21/67253* (2013.01)

(58) Field of Classification Search
CPC ....... G05D 7/0635; F16K 7/14; F16K 31/007; H01L 21/67069
(Continued)

(56) References Cited

U.S. PATENT DOCUMENTS

| | | | |
|---|---|---|---|
| 4,828,219 A * | 5/1989 | Ohmi | ........................ F16K 7/14 251/118 |
| 5,669,408 A | 9/1997 | Nishino et al. | |

(Continued)

FOREIGN PATENT DOCUMENTS

| | | |
|---|---|---|
| EP | 1 146 326 A2 | 10/2001 |
| JP | 8-338546 A | 12/1996 |

(Continued)

OTHER PUBLICATIONS

International Search Report issued in corresponding application PCT/JP2014/05885, completed Feb. 12, 2015 dated Feb. 24, 2015.

*Primary Examiner* — Minh Q Le
(74) *Attorney, Agent, or Firm* — Griffin and Szipl PC

(57) ABSTRACT

A pressure-type flow rate controller includes a body provided with a fluid passage which communicates a fluid inlet and a fluid outlet, a control valve for pressure control fixed to the body to open and close the fluid passage, an orifice arranged in the course of the fluid passage on the downstream side of the control valve, and a pressure sensor fixed to the body to detect the internal pressure of the fluid passage between the control valve and the orifice, wherein the fluid passage comprises a first passage portion communicating the control valve and a pressure detection chamber provided on a pressure detection surface of the pressure sensor, and a second passage portion spaced away from the first passage (Continued)

portion and communicating the pressure detection chamber and the orifice.

10 Claims, 9 Drawing Sheets

(51) Int. Cl.
 *F16K 7/14* (2006.01)
 *H01L 21/67* (2006.01)
 *F16K 31/00* (2006.01)
(58) Field of Classification Search
 USPC ...................................... 137/487.5, 486, 488
 See application file for complete search history.

(56) References Cited

U.S. PATENT DOCUMENTS

| | | | |
|---|---|---|---|
| 5,791,369 A | 8/1998 | Nishino et al. | |
| 5,816,285 A * | 10/1998 | Ohmi | G05D 7/0635 137/487.5 |
| 5,851,004 A * | 12/1998 | Wu | F16K 7/14 251/331 |
| 6,289,923 B1 | 9/2001 | Ohmi et al. | |
| 6,871,803 B1 * | 3/2005 | Ohmi | F16K 7/14 239/596 |
| 7,926,509 B2 * | 4/2011 | Ohmi | G05D 7/0635 137/341 |
| 8,181,932 B2 * | 5/2012 | Matsumoto | F16K 7/14 251/129.02 |
| 8,490,645 B2 * | 7/2013 | Igarashi | G01F 1/363 137/486 |
| 9,099,231 B2 * | 8/2015 | Robertson, III | F16K 7/14 |
| 9,163,743 B2 * | 10/2015 | Hidaka | F16K 7/14 |
| 9,507,352 B2 * | 11/2016 | Dohi | F16K 7/16 |
| 9,841,770 B2 * | 12/2017 | Hirata | G05D 7/0635 |
| 2004/0204794 A1 | 10/2004 | Ohmi et al. | |
| 2005/0092079 A1 * | 5/2005 | Ales | F16K 7/14 73/270 |
| 2008/0290312 A1 * | 11/2008 | Hirose | F16K 7/12 251/333 |
| 2010/0012026 A1 * | 1/2010 | Hirata | C23C 16/4481 118/666 |
| 2011/0120566 A1 | 5/2011 | Ohmi et al. | |
| 2014/0299201 A1 | 10/2014 | Hirose et al. | |
| 2016/0252913 A1 * | 9/2016 | Hirata | F16K 31/02 137/486 |
| 2017/0130848 A1 * | 5/2017 | Watanabe | F16K 7/14 |
| 2017/0212531 A1 * | 7/2017 | Nagase | G05D 7/0635 |
| 2017/0254430 A1 * | 9/2017 | Hirata | F16K 31/004 |

FOREIGN PATENT DOCUMENTS

| | | |
|---|---|---|
| JP | 10-055218 A | 2/1998 |
| JP | 11-345027 A | 12/1999 |
| JP | 2001-296198 A | 10/2001 |
| JP | 2003-195948 A | 7/2003 |
| JP | 2005-149075 A | 6/2005 |
| JP | 2006-330851 A | 12/2006 |
| WO | 99/63412 A1 | 12/1999 |
| WO | 2009/141947 A1 | 11/2009 |
| WO | WO2013/046660 A | 4/2013 |

* cited by examiner (a)

(b)

(c)

(d)

PRESSURE-TYPE FLOW RATE CONTROL DEVICE

This is a National Phase Application in the United States of International Patent Application No. PCT/JP2014/005885 filed Nov. 25, 2014, which claims priority on Japanese Patent Application No. 2013-252167, filed Dec. 5, 2013. The entire disclosures of the above patent applications are hereby incorporated by reference.

TECHNICAL FIELD

The present invention relates to an improvement of a pressure-type flow rate control device, and especially to a pressure-type flow rate control device with greatly increased operation performance of a material gas supply apparatus for semiconductor manufacturing devices and the like by enhancing fall response.

BACKGROUND ART

Heretofore, in a material gas supply apparatus for semiconductor manufacturing devices and the like, thermal flow rate control devices and pressure-type flow rate control devices are widely used for controlling the flow rates of supplied gases. Especially, as shown in FIG. 6, a pressure-type flow rate control device FCS is constituted by a control valve for pressure control CV, a temperature detector T, a pressure sensor P, an orifice OL, a calculation control unit CD consisting of a temperature correction/flow rate calculation circuit CDa, a comparator circuit CDb, input output circuit CDc, output circuit CDd and other components, and has excellent flow rate characteristics which allow performing stable flow rate control even if the primary side supply pressure greatly varies.

That is, in the pressure-type flow rate control device FCS in FIG. 6, the detection values from the pressure sensor P and the temperature detector T are input into the temperature correction/flow rate calculation circuit CDa, where the temperature correction and flow rate calculation of the detected pressure are carried out, and a flow rate calculation value Qt is input into the comparator circuit CDb. Moreover, an input signal $Q_s$ corresponding to the set flow rate is input from a terminal In, and is input into the comparator circuit CDb via the input output circuit CDc, where it is compared with the flow rate calculation value Qt from the temperature correction/flow rate calculation circuit CDa. When, as a result of the comparison, the set flow rate input signal Qs is smaller than the flow rate calculation value Qt, the control signal Pd is output to the drive part of the control valve CV. This drives the control valve CV to the closing direction, and drives to the closed valve direction until the difference (Qs−Qt) between the set flow rate input signal Qs and the calculation flow rate value Qt becomes zero.

In the pressure-type flow rate control device FCS, when a so-called critical expansion condition, that is, $P_1/P_2 \geq$ about 2, is retained between a downstream side pressure $P_2$ and an upstream side pressure $P_1$ of the orifice OL, the gas flow rate Q passing through the orifice OL becomes $Q=KP_1$ (wherein K is a constant), while when the critical expansion condition is not met, the gas flow rate passing through the orifice OL becomes $Q=KP_2{}^m(P_1-P_2)^n$ (wherein K, m, n are constants).

Therefore, the flow rate Q can be controlled with high accuracy by controlling the pressure $P_1$, and even if the pressure of an upstream side gas Go of the control valve CV is greatly changed, the control flow rate value hardly changes, exhibiting excellent characteristics.

The pressure-type flow rate control device which calculates the gas flow rate Q as $Q=KP_1$ (wherein K is a constant) may be referred to as FCS-N type, and the pressure-type flow rate control device which calculates the gas flow rate Q as $Q=KP_2{}^m(P_1-P_2)^n$ (wherein K, m, n are constants) may be referred to as FCS-WR type.

Furthermore, the pressure-type flow rate control devices of this type also include so-called FCS-SN types and FCS-SWR types. An FCS-SN type device uses, as the orifice of the above FCS-N type, an orifice mechanism in which a plurality of orifices OL are connected in parallel, and a gas flows through at least one orifice by a switching valve, e.g., an orifice mechanism in which two orifices are connected in parallel, and a switching valve is provided on the inlet side of one orifice to allow the flow rate control range to be changed by opening and closing the valve, while an FCS-SWR type device uses the same orifice mechanism as an orifice of the above FCS-WR type.

It should be noted that the configurations, operating principles, etc. of the pressure-type flow rate control devices themselves of the above FCS-N type, FCS-SN type, FCS-WR type and FCS-SWR type are already known, and therefore their detailed explanation will be omitted herein (Japanese Unexamined Patent Publication No. H8-338546, Japanese Unexamined Patent Publication No. 2003-195948, etc.).

Moreover, the types of the pressure-type flow rate control device FCS include, as shown in FIG. 7, a pressure-type flow rate control device FCS (hereinafter referred to as FCS-N type. Japanese Unexamined Patent Publication No. H8-338546, among others) which is intended for a gas fluid having a configuration as in (a) under critical conditions, a FCS-WR type which is intended for both gas fluids under critical conditions and non-critical conditions of (b) (Japanese Unexamined Patent Publication No. 2003-195948, among others), a flow rate switch type FCS-S which is intended for a gas fluid under critical conditions of (c) (Japanese Unexamined Patent Publication No. 2006-330851, among others), and FCS-SWR type of flow rate switch type which is intended for both gas fluids under both critical conditions and non-critical conditions of (d) (International Patent Publication WO2009/141947 pamphlet, among others).

It should be noted that in FIG. 7, $P_1$ and $P_2$ denote pressure sensors, CV denotes a control valve, OL denotes an orifice, $OL_1$ denotes a small-diameter orifice, $OL_2$ denotes a large-diameter orifice, and ORV denotes an orifice switching valve.

FIG. 8 is a cross-sectional view which shows a known pressure-type flow rate control device (FCS-WR type), 5A denotes a body, 2 denotes a fluid inlet, CV denotes a control valve for pressure control, $P_1$ and $P_2$ denote pressure sensors, OL denotes an orifice, and 3 denotes a fluid outlet.

However, the pressure-type flow rate control device FCS of this type has poor replaceability of the gas since the orifice OL with a minute diameter is used, and has the problem that the so-called fall response for the gas is extremely poor when the control valve for pressure control CV of the pressure-type flow rate control device FCS is closed and the output side is released as it takes long time to discharge the gas in a space portion between the control valve CV and the orifice OL.

FIG. 9 shows an example of the fall response characteristics at the time of continuous steps of a known pressure-type flow rate control device FCS-N type. When the amount of gas supplied is dropped in a stepwise manner while the gas is being supplied at a certain flow rate via the pressure-type flow rate control device with an air motor valve (not illustrated) on the downstream side of the orifice OL released, in the case of the pressure-type flow rate control device for small flow rates (line B) compared to the case of the pressure-type flow rate control device for large flow rates (line A), it takes 1.5 seconds or more to drop the flow rate to a predetermined level in the current situation.

More specifically, in the case of FCS-N type and FCS-WR type, the downstream side pressure of the orifice OL is 100 Torr, and therefore, in order to drop the flow rate from 100% to 1% and from 100% to 4%, it takes about 1 second or more respectively, but in terms of semiconductor manufacturing devices (for example, etchers), it is required to drop the flow rate from 100% to 1% within 1 second.

Moreover, in the case of the FCS-S type and FCS-SWR type, when the downstream side pressure of the orifice $OL_1$ is 100 Torr, in order to drop the flow rate from 100% to 10% and from 100% to 0.16%, it takes about 1.2 seconds or more respectively, but in terms of the semiconductor manufacturing device (for example, etcher), it is required to drop the flow rate from 100% to 10% within 1.2 seconds.

CITATION LIST

Patent Literature

Patent document 1: Japanese Unexamined Patent Publication No. H8-338546
Patent document 2: Japanese Unexamined Patent Publication No. H10-55218
Patent document 3: Japanese Unexamined Patent Publication No. 2003-195948
Patent document 4: Japanese Unexamined Patent Publication No. 2006-330851
Patent document 5: International Patent Publication WO2009/141947 pamphlet

SUMMARY OF INVENTION

Technical Problem

The invention of the present application mainly aims at, in order to solve the problems as stated above in a known pressure-type flow rate control device, an improvement in the fall response in flow rate control, that is, to provide a pressure-type flow rate control device which is capable of reducing the fall time in the flow rate control.

Solution to Problem

In order to achieve the above object, the pressure-type flow rate control device according to the present invention includes a body provided with a fluid passage which communicates a fluid inlet and a fluid outlet, a control valve for pressure control which is fixed to the body to open and close the fluid passage, an orifice which is arranged in the course of the fluid passage on the downstream side of the control valve for pressure control, and a pressure sensor which is fixed to the body to detect the internal pressure of the fluid passage between the control valve for pressure control and the orifice, the fluid passage including a first passage portion which connects the control valve for pressure control and a pressure detection chamber on a pressure detection surface of the pressure sensor, and a second passage portion connecting the pressure detection chamber and the orifice, which is spaced away from the first passage portion, whereby the fluid passage is configured to go through the pressure detection chamber.

It is preferable that the pressure sensor is arranged below the control valve for pressure control, and the first passage portion is configured to vertically extend from the control valve for pressure control to the pressure detection chamber.

It is preferable that the control valve for pressure control is provided with a metallic diaphragm valve element, and the first passage portion is configured to vertically extend from a central portion of the metallic diaphragm valve element of the control valve for pressure control.

It is preferable that the first passage portion is connected to an end portion of the pressure detection chamber.

It is preferable that the second passage portion is connected to an end portion of the pressure detection chamber.

It is preferable that the second passage portion is connected to an end portion opposite to the first passage portion of the pressure detection chamber.

Moreover, the pressure-type flow rate control device according to the present invention includes a body provided with a fluid passage which communicates a fluid inlet and a fluid outlet, a control valve for pressure control which is fixed to the body to open and close the fluid passage, an orifice which is arranged in the course of the fluid passage on the downstream side of the control valve for pressure control, and a pressure sensor which is fixed to the body to detect the internal pressure of the fluid passage between the control valve for pressure control and the orifice, the pressure sensor being arranged below the control valve for pressure control, the fluid passage including a first passage portion which vertically extends from the control valve for pressure control to a pressure detection chamber on the pressure detection surface of the pressure sensor, and a third passage portion which connects the first passage portion and the orifice.

It is preferable that the pressure sensor is inserted into a recessed portion formed on the bottom face of the body via a ring gasket, the pressure detection chamber being surrounded by the inner bottom face of the recessed portion, the ring gasket, and a pressure detection surface of the pressure sensor, and the ring gasket has their sealing faces on both sides formed to lean to the inner circumferential surface side.

It is preferable that the ring gasket includes sealing faces on both sides, an inner circumferential surface, an outer circumferential surface, an inner tapered face between the inner circumferential surface and sealing faces on both sides, and an outer tapered face between the outer circumferential surface and sealing faces on both sides, and that the inner tapered face is formed to be smaller than the outer tapered face.

Moreover, it is preferable that the pressure-type flow rate control device according to the present invention includes a body provided with a fluid passage which communicates a fluid inlet and a fluid outlet, a control valve for pressure control which is fixed to the body to open and close the fluid passage, a pressure sensor which is fixed to the body to detect the internal pressure of the fluid passage on the downstream side of the control valve for pressure control, and an orifice which is arranged in the course of the fluid passage on the downstream side of the pressure sensor, the pressure sensor is inserted into a recessed portion formed on the body bottom face via a ring gasket, the pressure detection chamber is surrounded by the inner bottom face of the recessed portion, the ring gasket, and a pressure detection surface of the pressure sensor, and the ring gasket has their sealing faces on both sides formed to lean to the inner circumferential surface side.

It is preferable that the distance between the inner bottom face of the recessed portion and the pressure detection surface is 0.13 to 0.30 mm.

Advantageous Effects of Invention

According to the invention of the present application, by providing the configuration where the fluid passage goes through the pressure detection chamber, the inner capacity of the fluid passage between the control valve for pressure control and the orifice can be reduced than in a conventional example, and as a result the fall characteristics can be improved.

Moreover, by arranging the pressure sensor below the control valve for pressure control and vertically extending the fluid passage (first passage portion) connecting the two components from the control valve for pressure control into the pressure detection chamber, the two components can be connected in the shortest distance, and the inner capacity of the fluid passage between the control valve for pressure control and the orifice can be reduced.

Moreover, a first passage portion and a second passage portion are provided on end portions of the pressure detection chamber, whereby the pressure detection chamber used as the fluid passage can be efficiently utilized, which can contribute to the reduction in the inner capacity of the fluid passage between the control valve for pressure control and the orifice.

Moreover, by giving the ring gasket which defines the height of the pressure detection chamber a cross-sectional shape whose sealing face is caused to lean to the inner circumferential surface side, the area of the sealing face necessary for ensuring the sealing performance can be maintained, and at the same time the inner circumferential surface can be approached to the flat surface to reduce the capacity of the space surrounded by the inner circumferential surface. This can contribute to the reduction in the inner capacity of the fluid passage between the control valve for pressure control and the orifice.

DESCRIPTION OF EMBODIMENTS

The embodiments of the pressure-type flow rate control device according to the present invention will be described below with reference to FIGS. 1 to 5.

Figure 1:
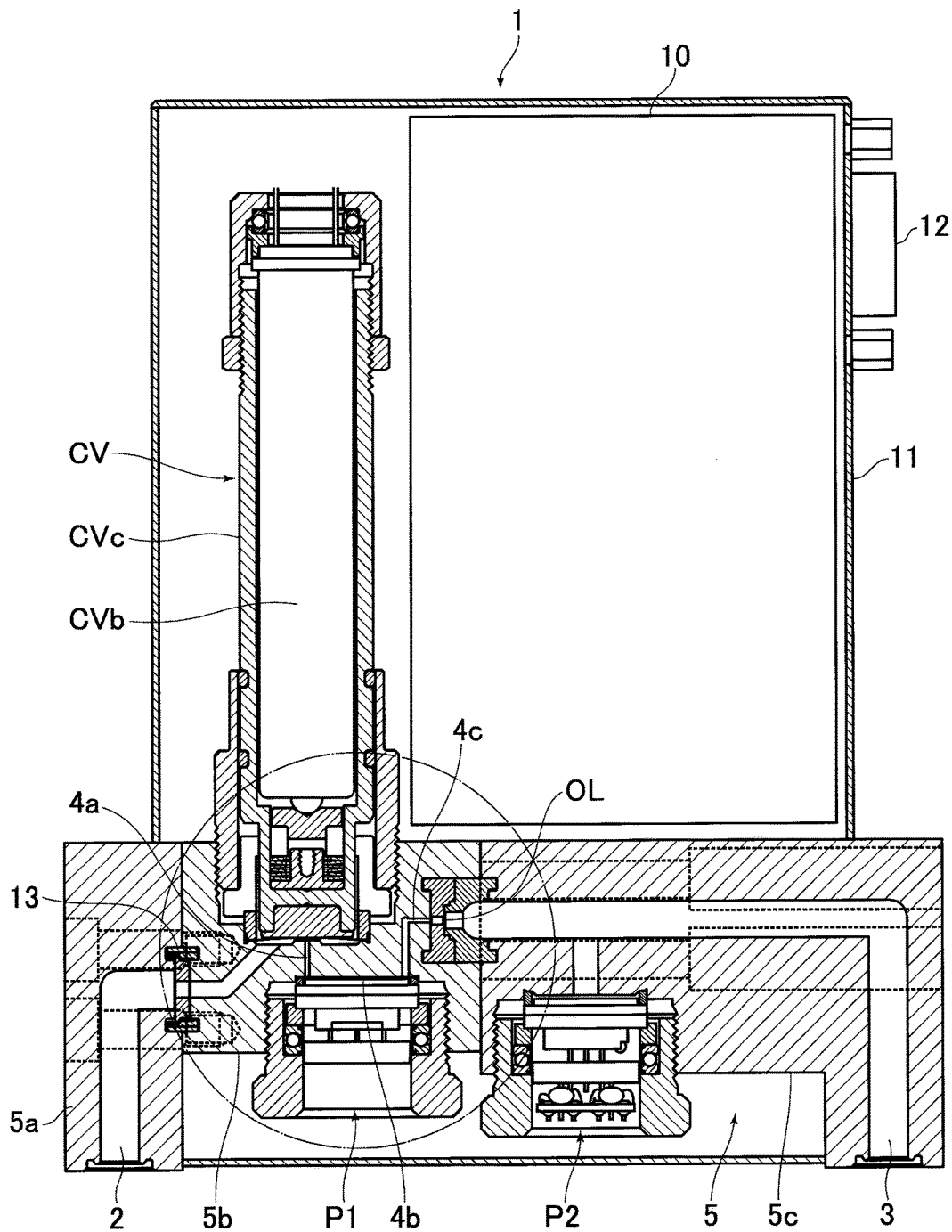
FIG. 1 is a cross-sectional view which shows a first embodiment of the pressure-type flow rate control device according to the present invention.
Figure 2:
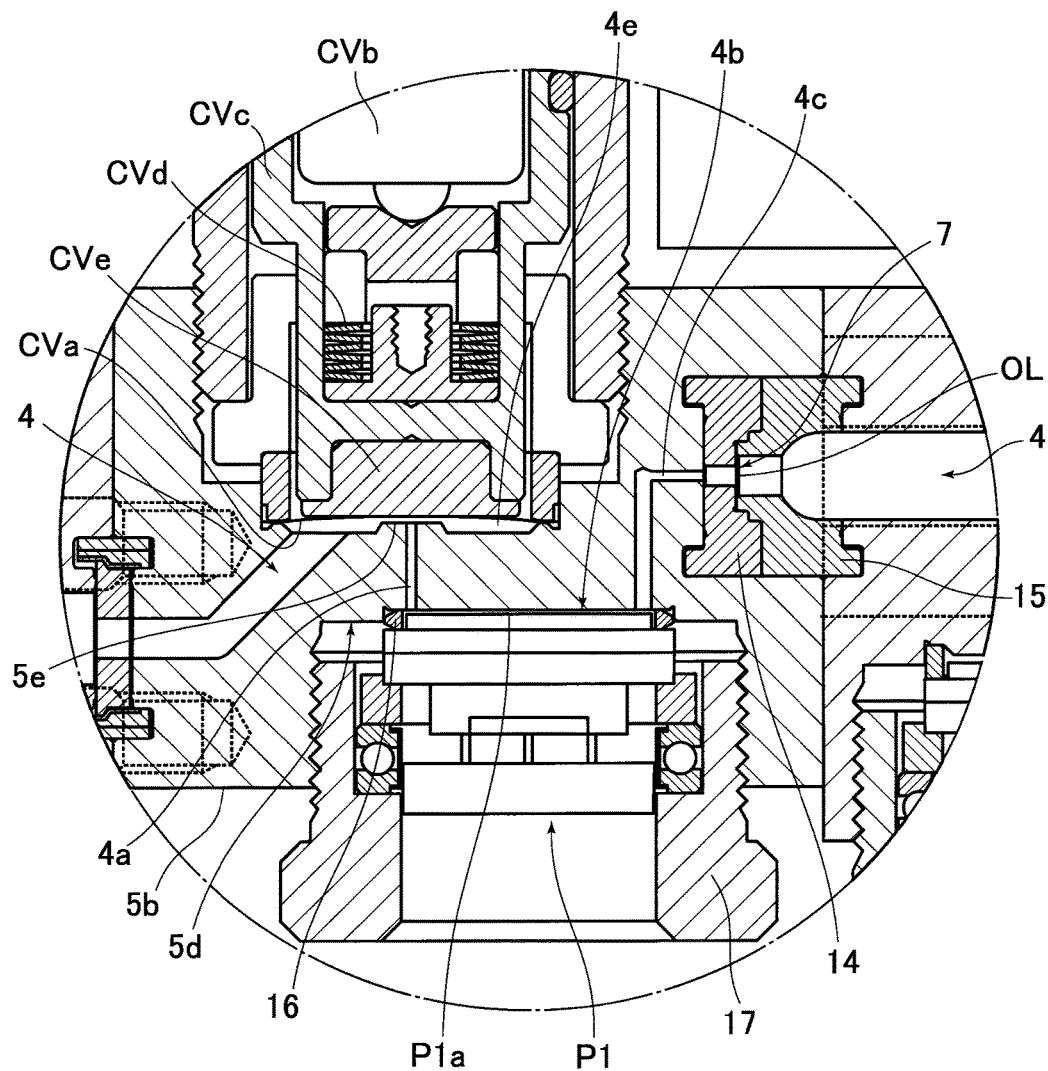
FIG. 2 is an enlarged diagram of a portion surrounded by the chain-line circle in FIG. 1.

FIG. 1 shows a cross-sectional view of a first embodiment of the pressure-type flow rate control device according to the present invention, and FIG. 2 shows an enlarged diagram of a portion surrounded by the chain-line circle in FIG. 1. A pressure-type flow rate control device 1 includes a body 5 provided with a fluid passage 4 which communicates a fluid inlet 2 and a fluid outlet 3, a control valve for pressure control CV which is fixed to the body 5 to open and close the fluid passage 4, an orifice OL arranged in the course of the fluid passage 4 on the downstream side of the control valve for pressure control CV, and a pressure sensor P1 which is fixed to the body 5 to detect the internal pressure of the fluid passage 4 between the control valve for pressure control CV and the orifice OL, the fluid passage 4 including a first passage portion 4a which connects the control valve for pressure control CV and a pressure detection chamber 4b on a pressure detection surface P1a (FIG. 2) of the pressure sensor P1, and a second passage portion 4c apart from the first passage portion 4a which connects the pressure detection chamber 4b and the orifice OL, whereby the fluid passage 4 is configured to go through the pressure detection chamber.

The pressure-type flow rate control device 1 of the first embodiment shown in FIG. 1 is of the so-called FCS-WR type mentioned above, and has a second pressure sensor P2 which detects the internal pressure of the fluid passage 4 on the downstream side of the orifice OL attached thereto. It should be noted that in FIG. 1, a reference sign 10 denotes a control board having electronic parts mounted on a printed wiring board, a reference sign 11 denotes a casing, and a reference sign 12 denotes a connector for connection.

The body 5 is integrally composed of an inlet side block 5a, a body block 5b, and an outlet side block 5c which are connected by bolts. The fluid inlet 2 is formed in the inlet side block 5a. In the connection portion of the fluid passage 4 between the inlet side block 5a and the body block 5b, a metal gasket 13 is arranged. Moreover, in the connection portion of the fluid passage 4 between the body block 5b and the outlet side block 5c, metal gaskets 14, 15 which nip an orifice plate 7 having the orifice OL (not clearly shown in the drawing since it is a micropore) formed at the center thereof are arranged. The fluid outlet 3 is formed in the outlet side block 5c.

The control valve for pressure control CV is an on-off valve which uses a known metallic diaphragm valve element CVa and a piezoelectric driven element CVb. The piezoelectric driven element CVb elongates by being energized, and pushes a cylinder CVc upwards against the elasticity of an elastic body CVd, whereby a valve element retainer CVe moves upwards, and the diaphragm valve element CVa comes back into a curved shape by its own elastic force to come off from a valve seat 5e, so that the valve is opened. Moreover, the valve opening position can be adjusted by varying the voltage applied to the piezoelectric driven element CVb.

The pressure sensor P1 includes a diaphragm having a semiconductor strain gauge formed on its surface. The surface thereof serves as a pressure detection surface (pressure-receiving surface), and is deformed by the pressure applied thereon. It detects the pressure by converting the changes in the electric resistance caused by the piezo resistance effect generated into electrical signals.

The pressure sensor P1 is inserted into a recessed portion 5d formed on the bottom face of the body block 5b via a ring gasket 16, and is fixed by a holding screw 17. Thus, by inserting the pressure sensor P1 into the recessed portion 5d, the pressure detection chamber 4b surrounded by the inner bottom face of the recessed portion 5d, the ring gasket 16, and the pressure-receiving surface of the pressure sensor P1, i.e., the pressure detection surface P1a is formed.

The valve seat 5e which the metallic diaphragm valve element CVa of the control valve for pressure control CV comes on and off is formed in a central position of the diaphragm valve element CVa. In the example shown, a gas is flown through a clearance 4e between the outer periphery of the diaphragm valve element CVa of the control valve for pressure control CV and the valve seat 5e, so that the gas flows out from the center of the valve seat 5e. This is opposite to the direction of flow of the fluid of the known control valve for pressure control shown in FIG. 8, so that such a configuration can, in a state that the diaphragm valve element CVa is closed, reduce the inner capacity of the fluid passage 4 between the control valve for pressure control CV and the orifice OL that in a known configuration.

The pressure sensor P1 is arranged below the control valve for pressure control CV, and the first passage portion 4a is configured to vertically extend to the pressure detection chamber 4b from the control valve for pressure control CV. This allows the first passage portion 4a to connect the control valve for pressure control CV and the pressure detection chamber 4b in the shortest distance, and therefore the inner capacity of the first passage portion 4a can be reduced.

Moreover, in order for the first passage portion 4a to have as small inner capacity as possible, it is preferable that the first passage portion 4a has as small a diameter as possible, for example, a diameter of 0.5 to 1.0 mm. Moreover, in order for the first passage portion 4a to have as small inner capacity as possible, the length of the first passage portion 4a is preferably as short as possible, which can be shortened by disposing the pressure sensor P1 as close to the diaphragm valve element CVa as possible.

The first passage portion 4a and the second passage portion 4c are connected to each end portion of the pressure detection chamber 4b. This configuration allows to reduce the inner capacity of the fluid passage 4 by using the pressure detection chamber 4b as the fluid passage 4 as much as possible. That is, the space volume of the pressure detection chamber 4b is inevitable, and therefore the inner capacity of the fluid passage 4 can be reduced by using this as the fluid passage.

Although it is also preferable that the inner capacity of the pressure detection chamber 4b is as small as possible, the diaphragm which is a component of the pressure-receiving surface of the pressure sensor P1 is formed of stainless steel or like materials, which expands at a high temperature and swells towards the inner bottom face side of the recessed portion 5d. Therefore, the pressure detection chamber 4b needs to have such a depth size that the heat expansion of the diaphragm of the pressure sensor P1 is allowed. For example, a certain type of the diaphragm of a pressure sensor swells up by about 0.13 mm at 100° C., the depth size of the pressure detection chamber 4b, that is, the distance between the inner bottom face of the recessed portion 5d and the pressure detection surface P1a (when not deformed) is to be, for example, 0.13 to 0.30 mm. The ring gasket 16 is formed of stainless steel or like materials, and is finished with high precision by mirror finish, solid solution heat treatment in a vacuum furnace, and other treatments.

Figure 3:
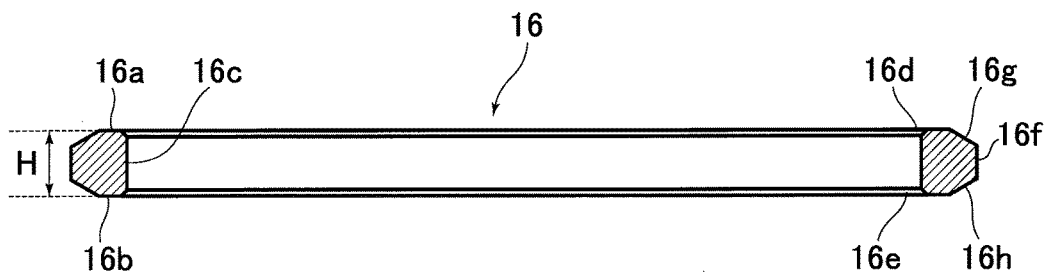
FIG. 3 is an expanded sectional view of the ring gasket attached to the pressure-type flow rate control device in FIG. 1.

The ring gasket 16 needs to have a sealing face with a certain level of surface pressure to ensure the sealing property as a gasket, but if the area of the sealing face is increased, the torque necessary for fixing the pressure sensor P1 is also increased. In order to minimize the inner capacity of the pressure detection chamber P1a, to maintain the sealing face of a required area, and also to prevent an increase in the material costs, the sealing faces on both sides 16a, 16b are formed to lean to the side of the inner circumferential surface 16c as shown in FIG. 3.

In the illustrated example, the ring gasket 16 has inner tapered faces 16d, 16e between the inner circumferential surface 16c and the sealing faces on both sides 16a, 16b, which are smaller than outer tapered faces 16g, 16h between an outer circumferential surface 16f and the sealing faces on both sides 16a, 16b. The inner tapered faces 16d, 16e may be eliminated, and the inner circumferential surface 16c and the sealing faces on both sides 16a, 16b may be perpendicular to each other.

Figure 10:
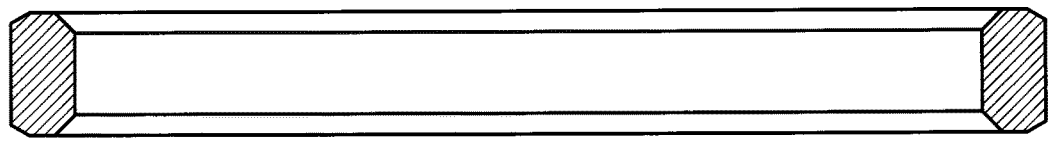
FIG. 10 is an expanded sectional view of the ring gasket attached to a known pressure-type flow rate control device.

Thus, by giving the sealing faces 16a, 16b cross-sectional shapes leaning to the side of the inner circumferential surface 16c, the inner capacity of the pressure detection chamber 4b can be smaller than in a known ring gasket (refer to FIG. 10).

Figure 4:
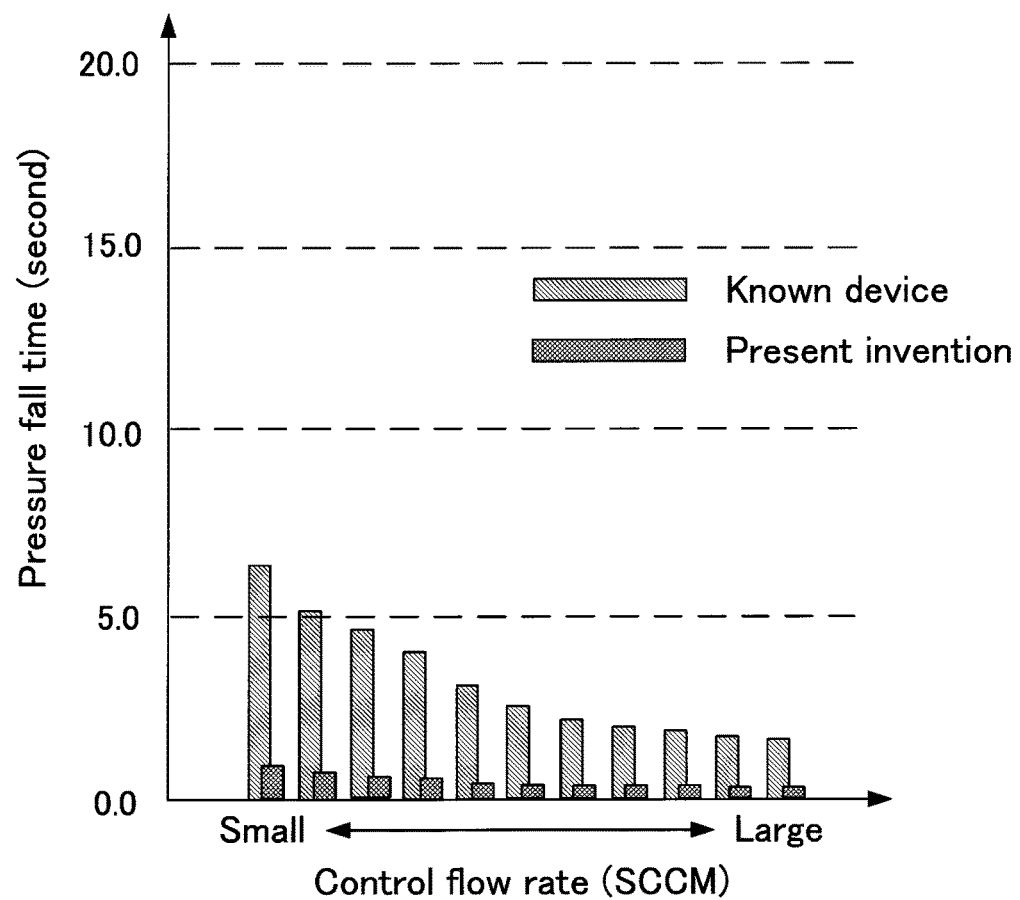
FIG. 4 is a graph which shows the pressure drop times (fall times) of the pressure-type flow rate control device according to the present invention and a known pressure-type flow rate control device.
Figure 8:
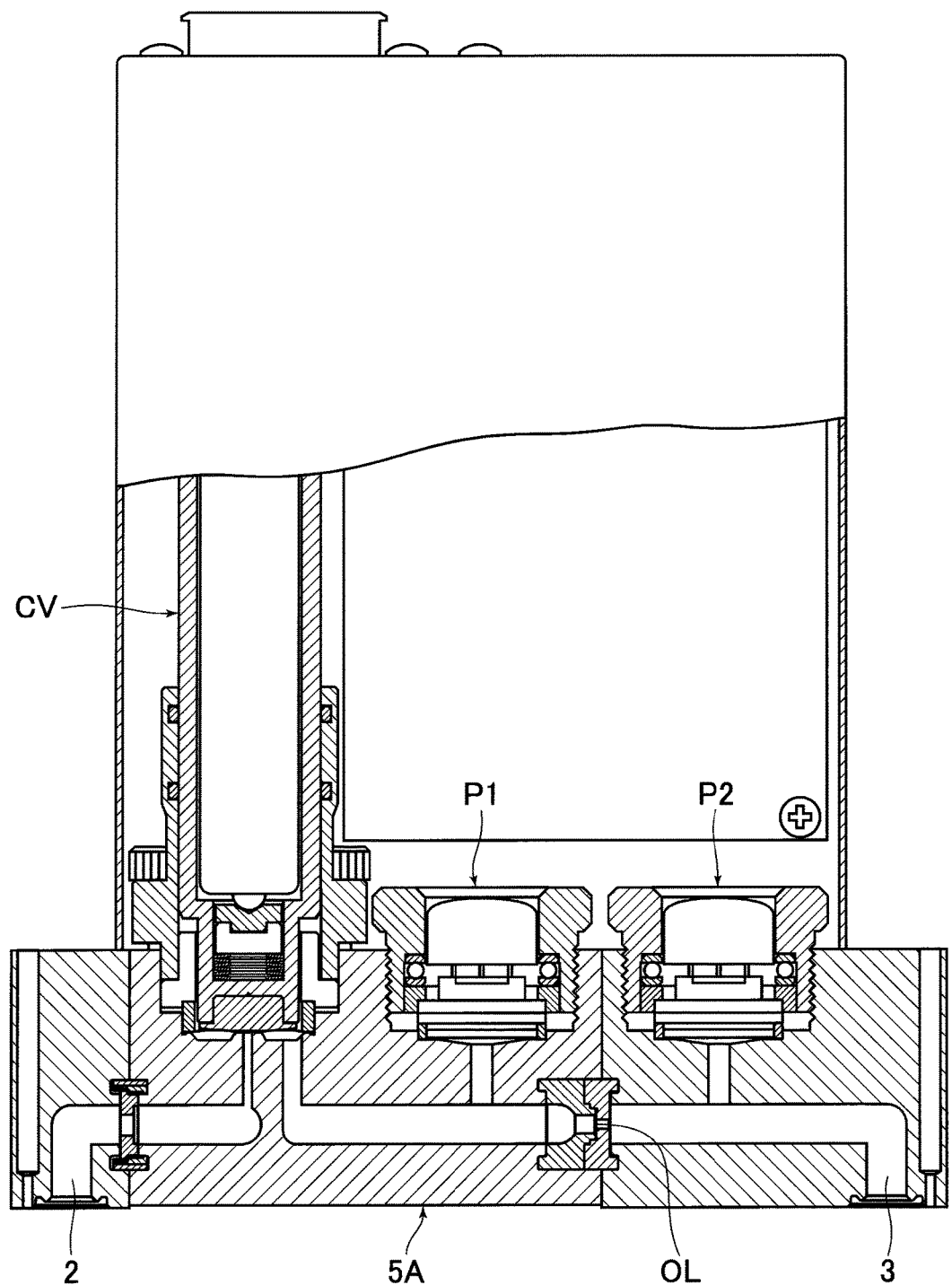
FIG. 8 is a cross-sectional view which shows a major part of a known pressure-type flow rate control device.
Figure 9:
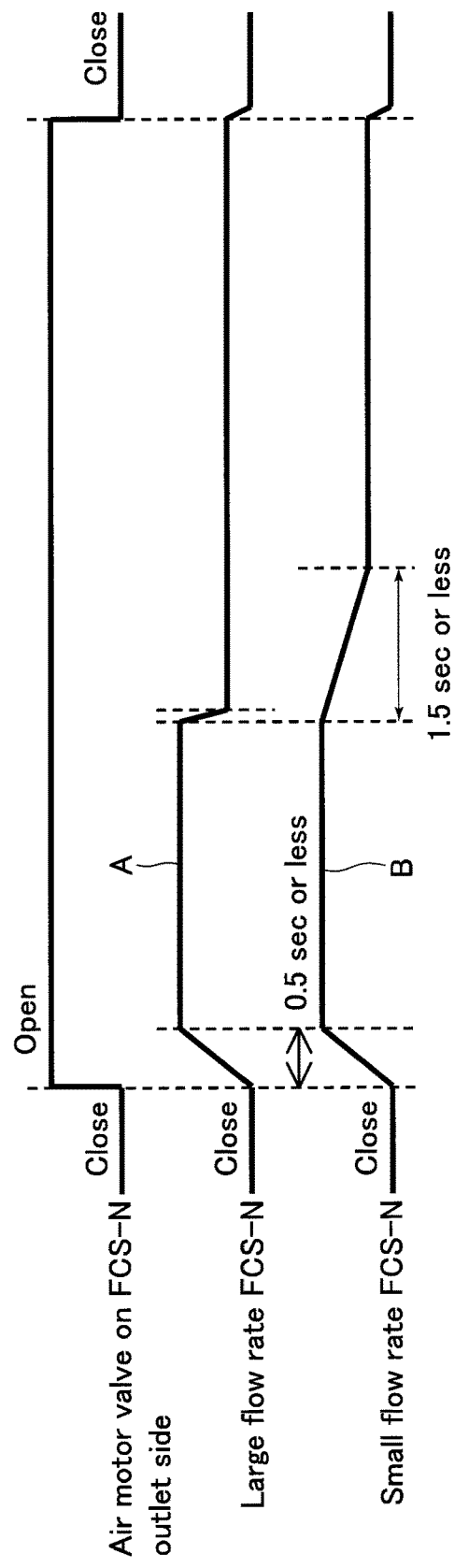
FIG. 9 is a graph which shows an example of the fall response characteristics at the time of continuous step of a known pressure-type flow rate control device (FCS-N type).

FIG. 4 is a bar graph in which the pressure-type flow rate control device of the structure shown in FIG. 1 and a pressure-type flow rate control device of a known type shown in FIG. 8 are each connect to a vacuum chamber of the fluid outlet, the control valve for pressure control is closed while a nitrogen gas is controlled at a predetermined flow rate, the fall time until the flow rate becomes from 100% to 1% is calculated from each of the inner capacities and compared with each other. In the graph of FIG. 4, the horizontal axis indicates a flow rate range, where the type with the highest control flow rate is indicated far right, while the vertical axis indicates the fall time. This bar graph reveals that the pressure-type flow rate control device of the present invention can greatly reduce the fall time compared to the conventional pressure-type flow rate control device. Moreover, it can be thought that in the pressure-type flow rate control device of the present invention can shorten the fall time to 1 second or less in most of the flow rate range.

Figure 5:
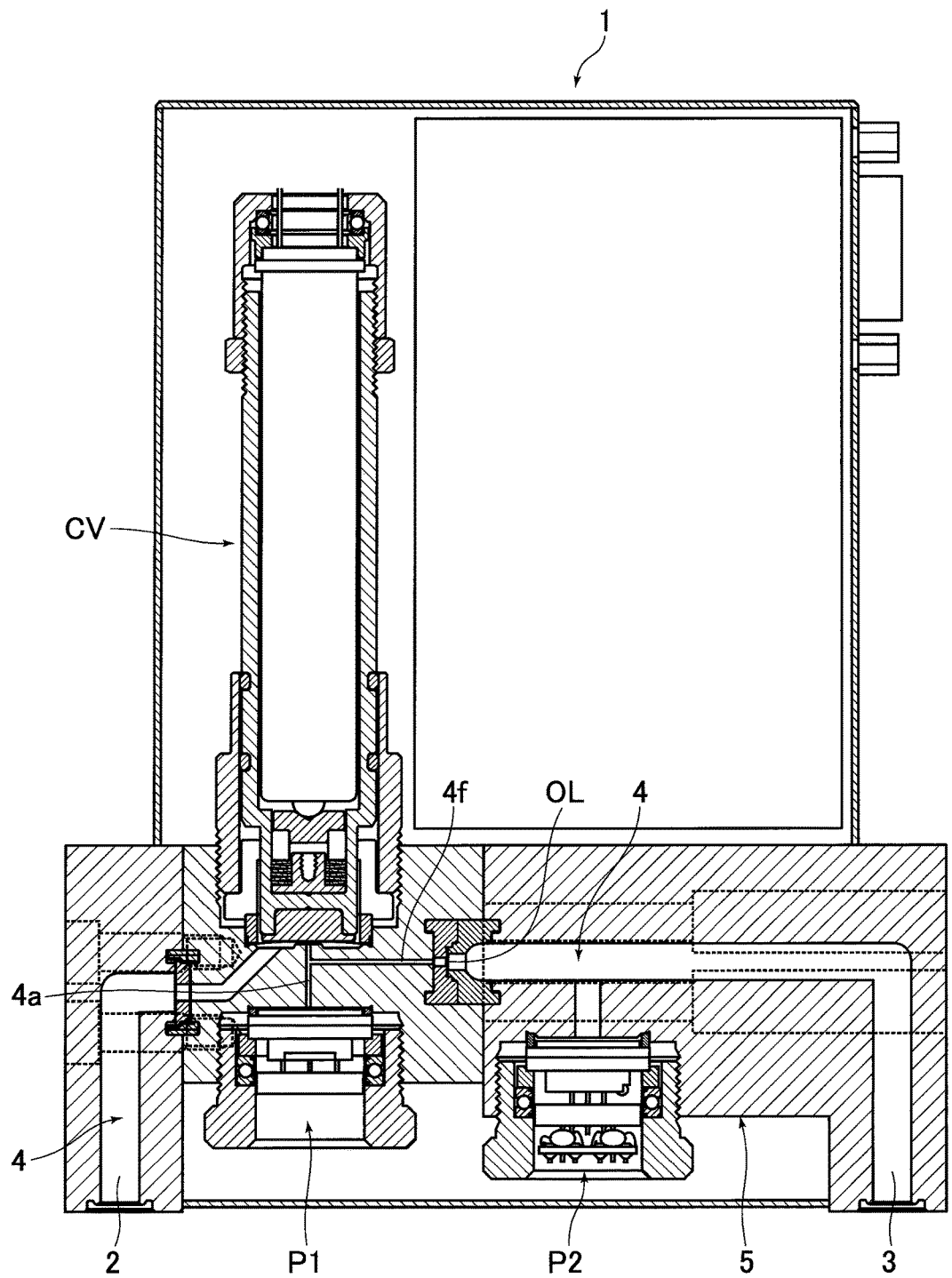
FIG. 5 is a cross-sectional view which shows a second embodiment of the pressure-type flow rate control device according to the present invention.
Figure 6:
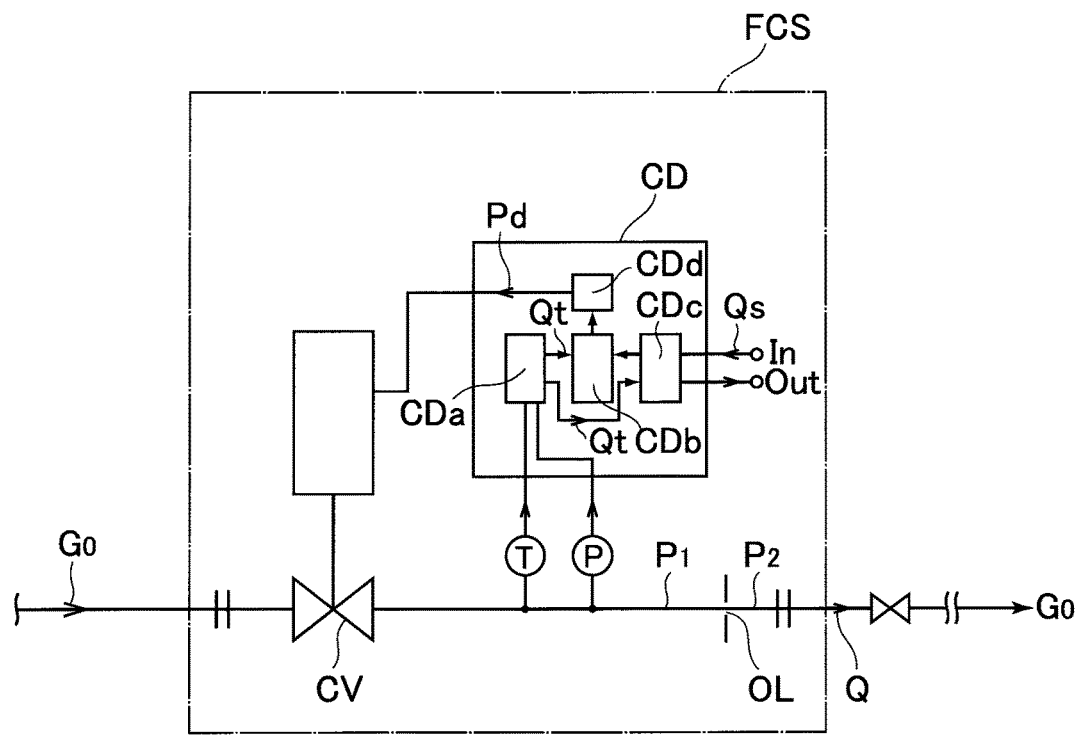
FIG. 6 is a basic block diagram which shows a known pressure-type flow rate control device.
Figure 7:
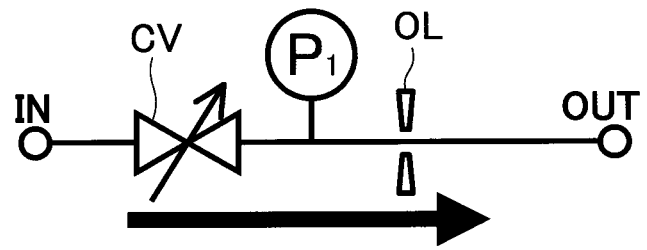
FIG. 7 is a schematic block diagram which shows pressure-type flow rate control devices of various known systems.
Figure 7:
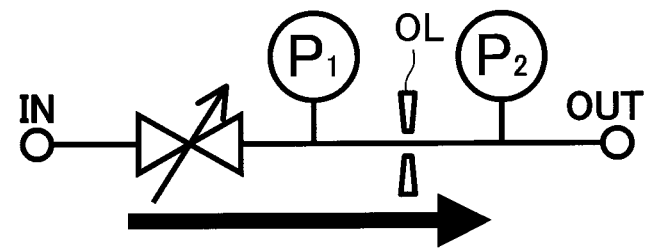
Figure 7:
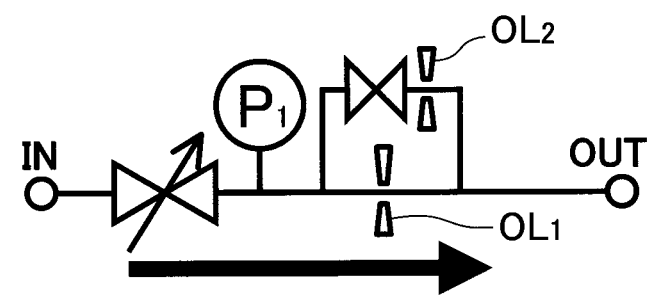
Figure 7:
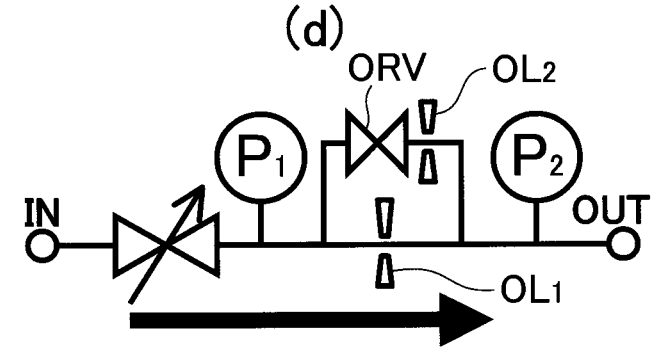

FIG. 5 is a cross-sectional view which shows a second embodiment of the pressure-type flow rate control device according to the present invention. The components similar to those in the embodiment in FIG. 1 will be referred to by the same numerals and their repeated explanation will be omitted.

The pressure-type flow rate control device 1 of the second embodiment is different from the above first embodiment in that it has a third passage portion 4f connected to the first passage portion 4a in place of the second passage portion 4c of the above first embodiment, and the other configurations similar to that in the above first embodiment. Also in the second embodiment, the arrangement of the control valve for pressure control CV and the pressure sensor P1 and the arrangement structure of the first passage portion 4a are the same in the first embodiment, whereby the inner capacity of the fluid passage 4 which is related to the fall time can be reduced.

The present invention is not limitedly interpreted to the above embodiments, but may be subject to various changes within such a range that does not deviate from the spirit of the present invention.

REFERENCE SIGNS LIST

1 Pressure-type flow rate control device
2 Fluid inlet
3 Fluid outlet
4 Fluid passage
4a First passage portion
4b Pressure detection chamber
4c Second passage portion
4f Third passage portion
5 Body
5d Recessed portion
CV control valve for pressure control
CVa Metallic diaphragm valve element
OL Orifice
P1 Pressure sensor
P1a Pressure detection surface
16 Ring gasket

The invention claimed is:

1. A pressure-type flow rate control device comprising:
a body provided with a fluid passage communicating a fluid inlet and a fluid outlet,
a control valve for pressure control fixed to the body to open and close the fluid passage,
an orifice arranged in the course of the fluid passage on the downstream side of the control valve for pressure control, and
a pressure sensor fixed to the body to detect the internal pressure of the fluid passage between the control valve for pressure control and the orifice, wherein,
the fluid passage comprises a first passage portion communicating the control valve for pressure control and a pressure detection chamber on a pressure detection surface of the pressure sensor, and a second passage portion spaced away from the first passage portion and communicating the pressure detection chamber and the orifice, whereby the fluid passage is configured to go through the pressure detection chamber, wherein
the pressure sensor is arranged below the control valve, and the first passage portion vertically extends from a central portion of a valve element of the control valve to an end portion of the pressure detection chamber, and wherein
the second passage portion comprises a vertical part connected to an opposite end portion of the pressure detection chamber and a horizontal part extending from the vertical part, the orifice being positioned near an end portion of the horizontal part.

2. The pressure-type flow rate control device according to claim 1, wherein the control valve for pressure control comprises a metallic diaphragm valve element, and the first passage portion is configured to vertically extend from a central portion of the metallic diaphragm valve element of the control valve for pressure control.

3. The pressure-type flow rate control device according to claim 1, wherein the pressure sensor is inserted into a recessed portion formed on a bottom face of the body via a ring gasket, the pressure detection chamber being surrounded by an inner bottom face of the recessed portion, the ring gasket, and the pressure detection surface of the pressure sensor, and wherein the ring gasket has sealing faces on both sides formed to lean to the side of the inner circumferential surface side.

4. The pressure-type flow rate control device according to claim 3, wherein the distance between the inner bottom face of the recessed portion and the pressure detection surface is 0.13 to 0.30 mm.

5. The pressure-type flow rate control device according to claim 3, wherein the ring gasket comprises sealing faces on both sides, an inner circumferential surface, an outer circumferential surface, inner tapered faces between the inner circumferential surface and sealing faces on both sides, and outer tapered faces between the outer circumferential surface and sealing faces on both sides, and the inner tapered faces are smaller than the outer tapered faces.

6. The pressure-type flow rate control device according to claim 1, wherein diameters of the first passage portion and the second passage portion are smaller than that of an inlet side passage portion communicating the fluid inlet and a circumferential portion of the control valve.

7. The pressure-type flow rate control device according to claim 6, wherein the inlet side passage portion is formed in the body and is obliquely connected to the circumferential portion of the control valve.

8. The pressure-type flow rate control device according to claim 1, wherein a diameter of the first passage portion is smaller than that of the vertical part of the second passage portion and wherein the first passage portion is shorter than the vertical part of the second passage portion.

9. The pressure-type flow rate control device according to claim 1, wherein a diameter of an outlet side passage portion communicating the orifice and the fluid outlet is larger than that of the horizontal part of the second passage portion.

10. The pressure-type flow rate control device according to claim 1, wherein the end portion of the pressure detection chamber is located directly below the central portion of the valve element and the opposite end portion of the pressure detection chamber is located outside the valve element.

* * * * *